(12) United States Patent
Chainer

(10) Patent No.: US 7,888,792 B2
(45) Date of Patent: Feb. 15, 2011

(54) METHOD FOR DIRECT HEAT SINK ATTACHMENT

(75) Inventor: Timothy J Chainer, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/535,394

(22) Filed: Aug. 4, 2009

(65) Prior Publication Data
US 2010/0033935 A1 Feb. 11, 2010

Related U.S. Application Data

(62) Division of application No. 11/761,234, filed on Jun. 11, 2007.

(51) Int. Cl.
*H01L 23/10* (2006.01)
*H01L 21/00* (2006.01)

(52) U.S. Cl. .................. 257/706; 257/678; 257/707; 257/E23.08; 438/122

(58) Field of Classification Search ......... 257/678–733, 257/787–796, E23
See application file for complete search history.

(56) References Cited

U.S. PATENT DOCUMENTS

| 6,618,251 B2 | 9/2003 | Ishimine | |
|---|---|---|---|
| 7,080,989 B2 | 7/2006 | Gates | |
| 2006/0007800 A1* | 1/2006 | Basu | 369/44.14 |
| 2006/0185836 A1* | 8/2006 | Garner | 165/185 |

\* cited by examiner

*Primary Examiner*—N Drew Richards
*Assistant Examiner*—Mamadou Diallo
(74) *Attorney, Agent, or Firm*—Michael J. Buchenhorner; Vazken Alexanian

(57) ABSTRACT

A system and method of attaching a heat sink to an integrated circuit chip includes providing a compliant material for constraining the heat sink's mechanical motion while simultaneously allowing for thermal expansion of the heat sink.

2 Claims, 10 Drawing Sheets

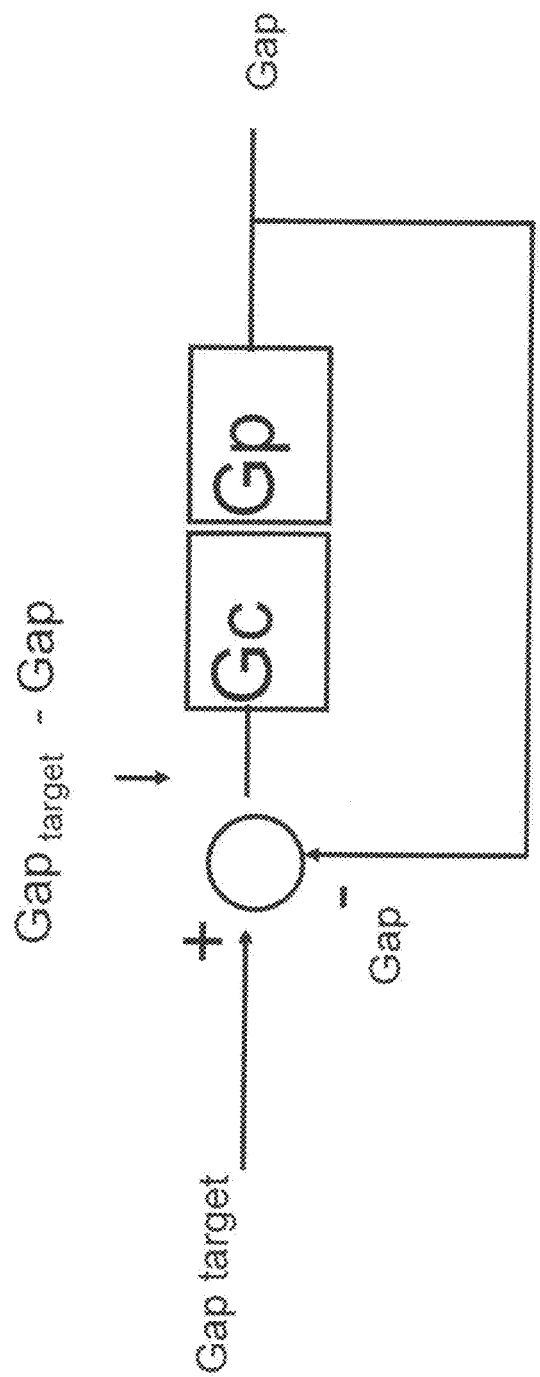
FIG. 10 – Active Non-contact

METHOD FOR DIRECT HEAT SINK ATTACHMENT

CROSS-REFERENCE TO RELATED APPLICATIONS

This application is a division of, and claims priority from, commonly-owned, co-pending U.S. patent application Ser. No. 11/761,234, filed on Jun. 11, 2007.

STATEMENT REGARDING FEDERALLY SPONSORED-RESEARCH OR DEVELOPMENT

Not Applicable.

INCORPORATION BY REFERENCE OF MATERIAL SUBMITTED ON A COMPACT DISC

Not Applicable.

FIELD OF THE INVENTION

The invention disclosed broadly relates to the field of cooling of semiconductor chips, and more particularly relates to attachment of heat sinks to semiconductor chips.

BACKGROUND OF THE INVENTION

The performance of integrated electronics chips has increased dramatically over recent years. This increased performance has been achieved in part by increasing the chip operating frequency which has resulted in greater chip power (Watts) and chip power density (Watts/cm2). This has increased the need for efficient thermal power management to conduct the heat away from the chip to the ambient surroundings using for example heat sinks, fans, vapor chambers, liquid coolers and other means to cool the chips to maintain an acceptable operating temperature. Today's powerful processors generate so much heat that chips will thermally overheat if the thermal cooling solution is not operational even for a short period of time. A heatsink is a device that is attached to the microprocessor chip to keep it from overheating by providing a thermal conduction path of the heat generated by the chip to the ambient environment by moving air over the heat sink. Basic heat sink structures have a heat spreader which makes thermal contact with the chip via an interface of a thermally conductive adhesive and fins which provide a large surface area to transfer the heat to the ambient air environment. Typically a fan is used to provide an air flow over the fins to optimize the heat transfer from the heat sink to the ambient air.

Most commercially available computers incorporate a heat sink directly attached to the chip. This combination of the chip and heat sink is often referred to as a "chip package." The basic design of a chip package is shown in FIG. 1 in which a heatsink 102 is mounted on a chip 120. The heatsink 102 shown is a conventional passive metal heat sink with fins. The chip 120 makes thermal contact with the heat sink 102 through a thermal interface material 111. The chip 120 is attached to a chip carrier 122 which has a pin grid array and interfaces to an electrical socket 110 which is mounted onto a printed circuit board 125. The heat sink 102 is secured to the chip 120 by a frame 112 and mounting screws 116 in order to inhibit horizontal and vertical movement of the heat sink as would occur under external forces, including shock and vibration of the system. FIG. 2 shows the top view of the chip package of FIG. 1.

Clearly this design is meant to stabilize and constrain the heatsink 102 and it is effective in doing so. The problem inherent in this design, however, is that the rigid assembly results in deformation of the entire package due to differences in the coefficient of thermal expansion (CTE) between the heatsink 102 and the chip package assembly. The need to constrain the mechanical motion of the heat sink 102 due to external forces (shocks) requires a rigid, non-compliant attachment which unfortunately results in package deformation. Contributing to this problem is the rigidity and non-compliance inherent in heatsinks, which are usually metal structures. Currently produced heatsinks fail to provide for the structural stresses and strains generated during the operation of the electronic device (the chip 120). Therefore, there is a need for a solution that overcomes the above shortcomings of the prior art.

SUMMARY OF THE INVENTION

Briefly, according to an embodiment of the invention, a system and method of attaching a heat sink to an integrated circuit chip includes providing a compliant material for constraining the heat sink mechanical motion while simultaneously allowing for thermal expansion of the heat sink; and providing at least one mechanical limit stop disposed between the heat sink and a frame. Additionally, the invention provides for placing the compliant material between the heat sink and the at least one mechanical limit stop. Further horizontal constraint pads are positioned between the heat sink and the at least one mechanical limit stop. Vertical constraint pads can be positioned between the heat sink and the at least one mechanical limit stop.

According to another embodiment of the present invention, a structure for attaching a heat sink to an integrated circuit chip includes a set of ball bearings positioned to allow motion of the heat sink in the X and Y directions while constraining motion in the Z direction. The ball bearings are attached using braces with each ball bearing positioned at the corner sidewalls of the heat sink such that force applied to the ball bearing from the heat sink will prevent mechanical movement of the heat sink in a vertical direction.

According to another embodiment of the present invention, a structure for attaching a heat sink to an integrated circuit chip includes a servo control system. The servo control system includes a voice coil motor to actuate the heat sink. Further, at least one gap sensor creates a position signal between the heat sink and a fixed frame.

According to another embodiment of the present invention, an attachment structure for attaching a heat sink to an integrated circuit chip includes: a platform for the heat sink; a plurality of horizontal limit stops including compliant material for constraining mechanical motion of the heat sink while allowing for thermal expansion of the heat sink in a chip package, wherein each horizontal limit stop is positioned on the platform such that the compliant material makes contact with the heat sink and the chip; and a plurality of vertical limit stops including compliant material, wherein each vertical limit stop is positioned on the platform such that the compliant material makes contact with a bottom surface of the heat sink and the chip.

BRIEF DESCRIPTION OF THE DRAWINGS

To describe the foregoing and other exemplary purposes, aspects, and advantages of the present invention, we use the following detailed description of exemplary embodiments of the invention with reference to the drawings, in which:

FIG. 10 shows a diagram of the servo control system of FIG. 7, according to an embodiment of the present invention.

DETAILED DESCRIPTION

We describe an attachment method for a heat sink, according to an embodiment of the present invention. As will be shown, the present embodiment changes the mechanical boundary conditions of the heat sink to allow slowly varying relative motion while still providing mechanical support for shock inputs. This is accomplished by changing the method of heat sink attachment, such that mechanical motion is limited under shock but provides compliance for thermal expansion. As such this will reduce the heat sink/package mechanical interaction due to the mismatch of the coefficients of thermal expansion (CTE) for those materials. A CTE mismatch occurs when the heat sink material experiences thermal expansion at a different rate than that of the frame. This is one of the main causes of package deformation.

Figure 1:
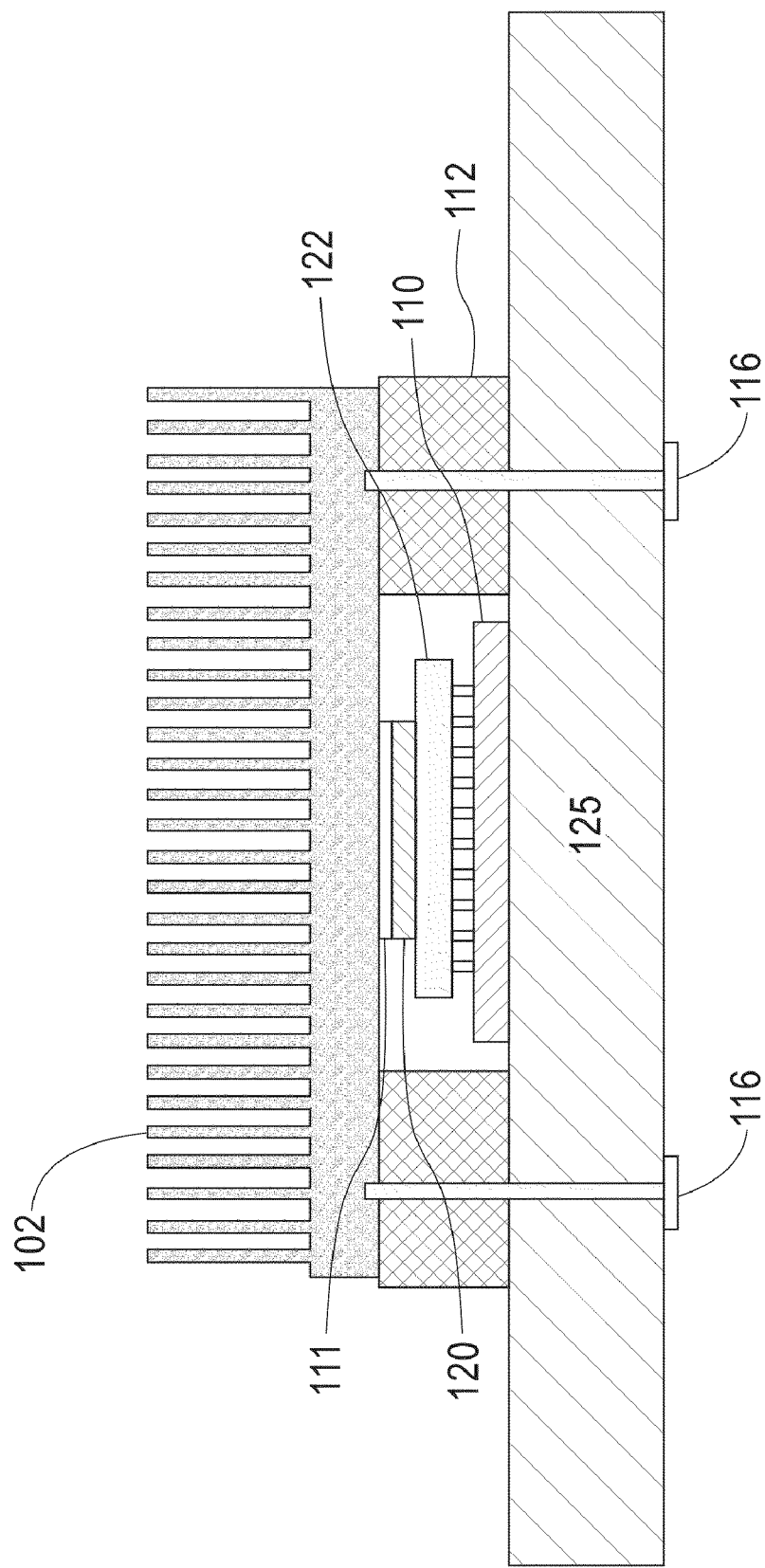
FIG. 1 is an illustration of a cross-section view of a basic chip package design with a passive heatsink, according to the known art.
Figure 2:
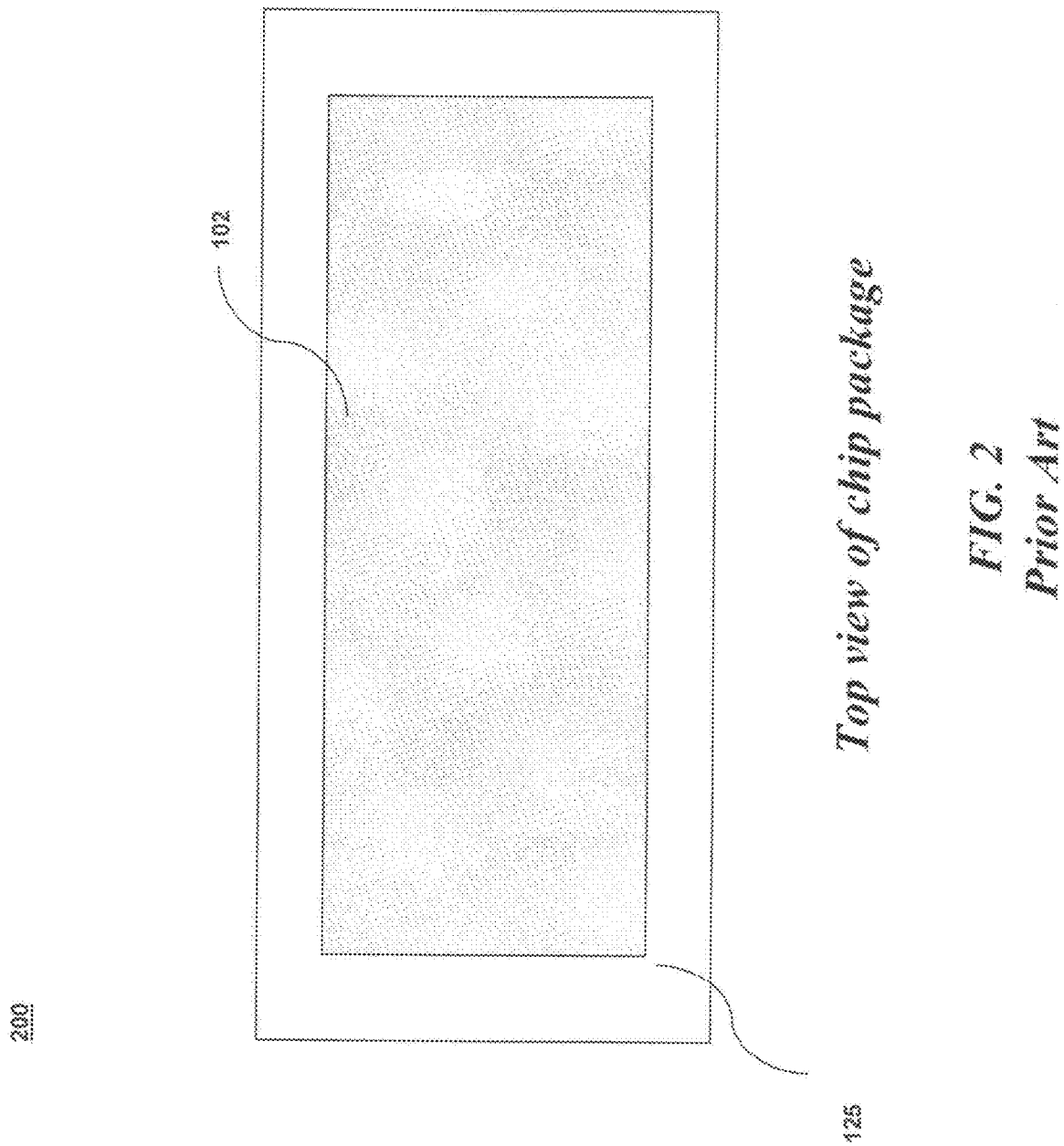
FIG. 2 is an illustration showing the top view of the basic chip package of FIG. 1, according to the known art.
Figure 3A:
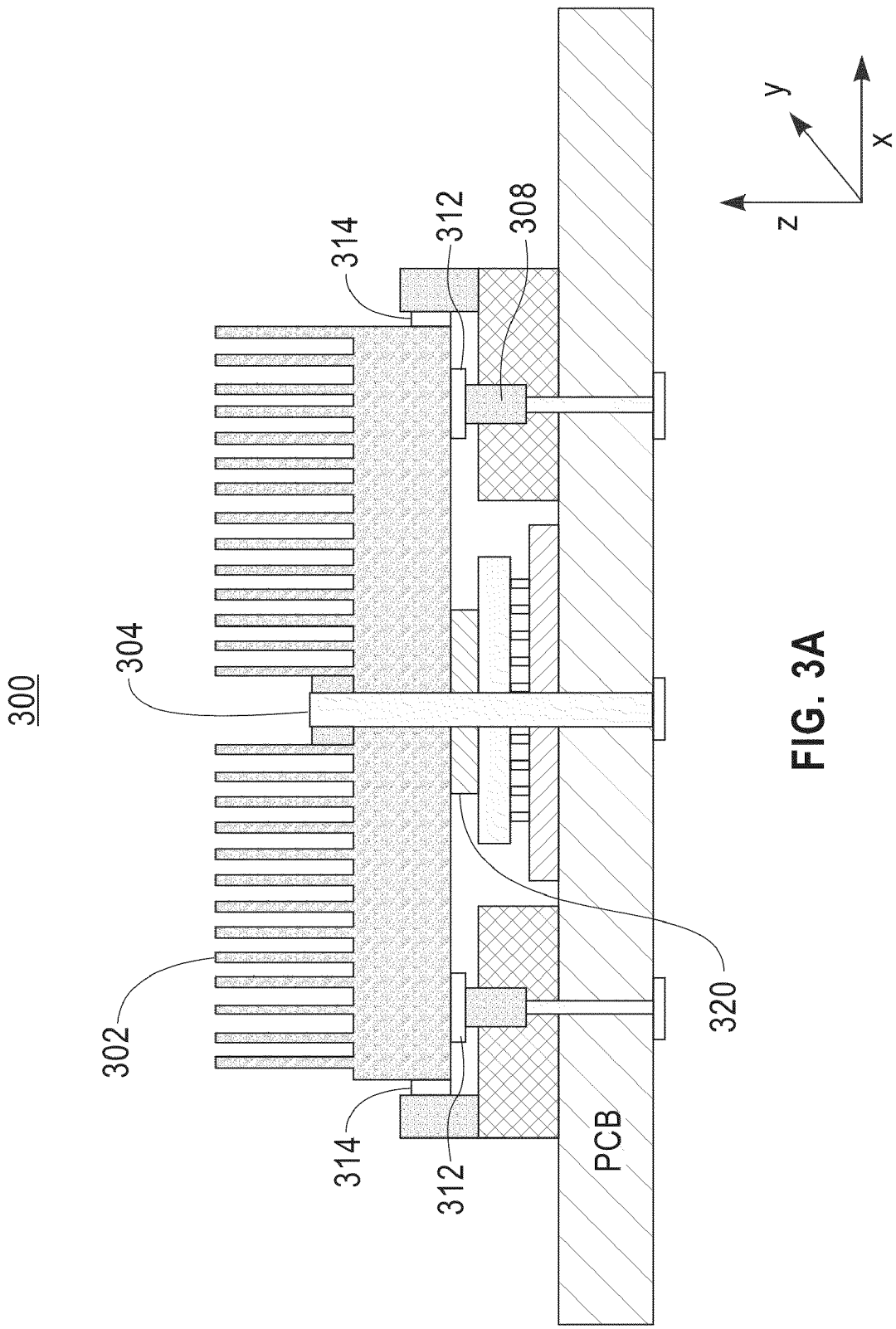
FIG. 3a is a side view of a chip package assembly according to an embodiment of the present invention.

Referring now in specific detail to the drawings, and particularly FIG. 3a there is shown a side view of a chip package assembly 300 with attached heat sink 302. According to an embodiment of the present invention, pads 312 and 314 are fabricated from a highly damped elastomeric material such as those commercially available as C-1105 from EAR Specialty Composites. These materials are also viscoelastic in that they exhibit both the properties of a viscous liquid which "flows" at slow deformation speeds and an elastic solid at higher speeds. These materials have a frequency dependent elastic modulus which increases at higher frequencies, thus becoming stiffer if the load changes quickly.

Figure 3B:
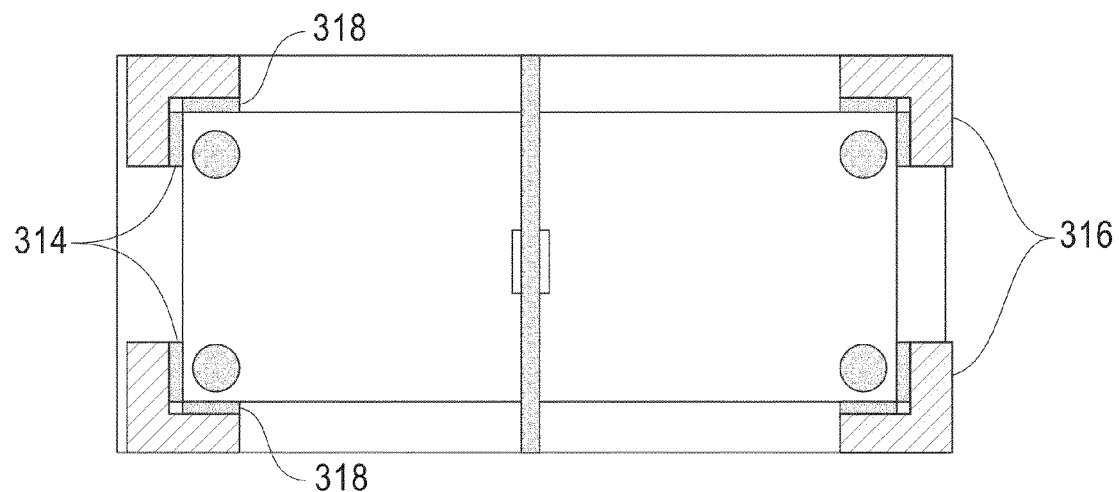
FIG. 3b is a top view of the chip package assembly according to an embodiment of the present invention.

FIG. 3b shows a top view of the chip package assembly 300. The elastomeric material is used in the X and Y pads 314 and 318 at the corner mounts of the heat sink 302 to control motion of the heat sink 302 in the X and Y directions as well as the Z pads 312 at the bottom side of the heat sink 302 corners to control motion in the Z direction.

As shown in FIG. 3b the X and Y pads 314 and 318 are disposed at the corner mounts, positioned between the heat sink 302 and the horizontal limit stops 316. Pads 312 are also positioned between the heat sink 302 and the vertical stops 308. The viscoelastic material is sufficiently rigid that it limits mechanical motion in the presence of shocks; yet it provides compliance sufficient to handle the thermal expansion mismatch of the heat sink/package 300. The positioning of the pads will reduce the effects of shock from X, Y, and Z forces exerted on the heat sink 302. Positioning the pads 314 at the bottom only will limit the effects from a Z force shock only.

The key advantages of employing the pads 312, 314, 318 at the corner mounts and the bottom of the heat sink 302 are: 1) they allow mechanical motion from thermal expansion; and 2) they restrict mechanical motion due to shock. The key aspects of the pads are the viscoelastic properties of the material used and the positioning of the pads with respect to the heat sink 302.

Figure 3C:
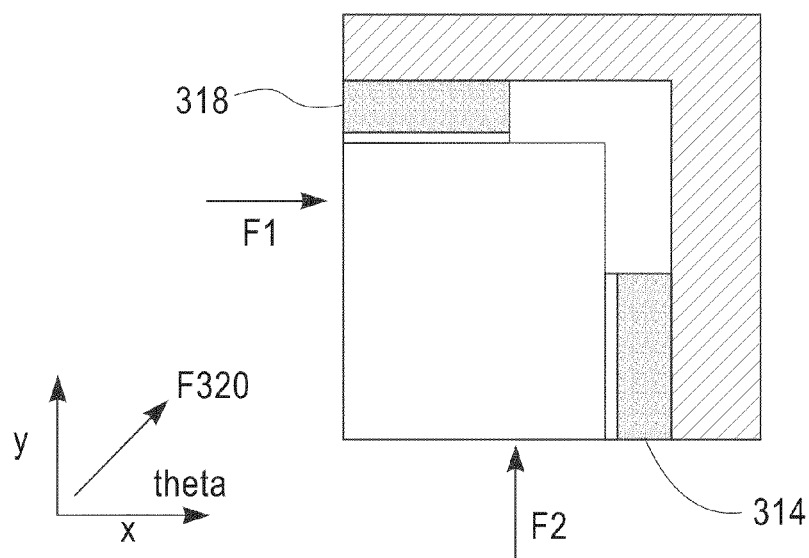
FIG. 3C is a detailed view of the corner of the chip package assembly according to an embodiment of the present invention.

FIG. 3c presents a detailed view of one corner of the chip assembly package 300 of FIGS. 3a and 3b. This view shows the corner of the heat sink 302 which is abutted by pads 314 and 318 which may be, for example, attached to the limit stop 316 and the heat sink 302 with an adhesive glue. When a force F2 is applied to the heat sink 302, pad 318 is compressed. However, as the elastic modulus of the pad 318 is frequency dependent, the restoring force would depend upon the frequency of the applied force. For slowly varying forces such as would occur with thermal expansion, pad 318 would be soft, but for higher frequency forces the pad 318 would be very stiff. This allows the heat sink 302 to expand due to temperature changes, but provides constraint of the heat sink 302 for high frequency forces. Note that pad 314 experiences a shear force during the applied force F2 and allows movement of the heat sink 302 both for thermal and high frequency forces.

For a force F (320) in the X, Y plane the pad 314 would experience a force $F1=F \cos(\theta)$ and pad 318 would experience a force $F2=F \sin(\theta)$. Each pad would respond as described above.

As the package may experience a force in any arbitrary direction, the heat sink 302 can experience a force which has components in the X, Y and Z planes. As shown in the three-dimensional (3D) view of FIG. 4, the pads in the Z direction will compress when a force has a downward Z component. The clamp 304 holds the center of the heat sink 302 in the Z direction and applies a downward bias force on the pads 312 which prevents the heat sink from lifting off the chip 320 when there is an upward Z component. To minimize the deflection of the pad 312 to the bias force a higher modulus elastomer may be deployed or the pad thickness may be reduced. In one example the dimension of the pads may measure 5 mm by 5 mm and have a thickness of 1 mm.

Figure 4:
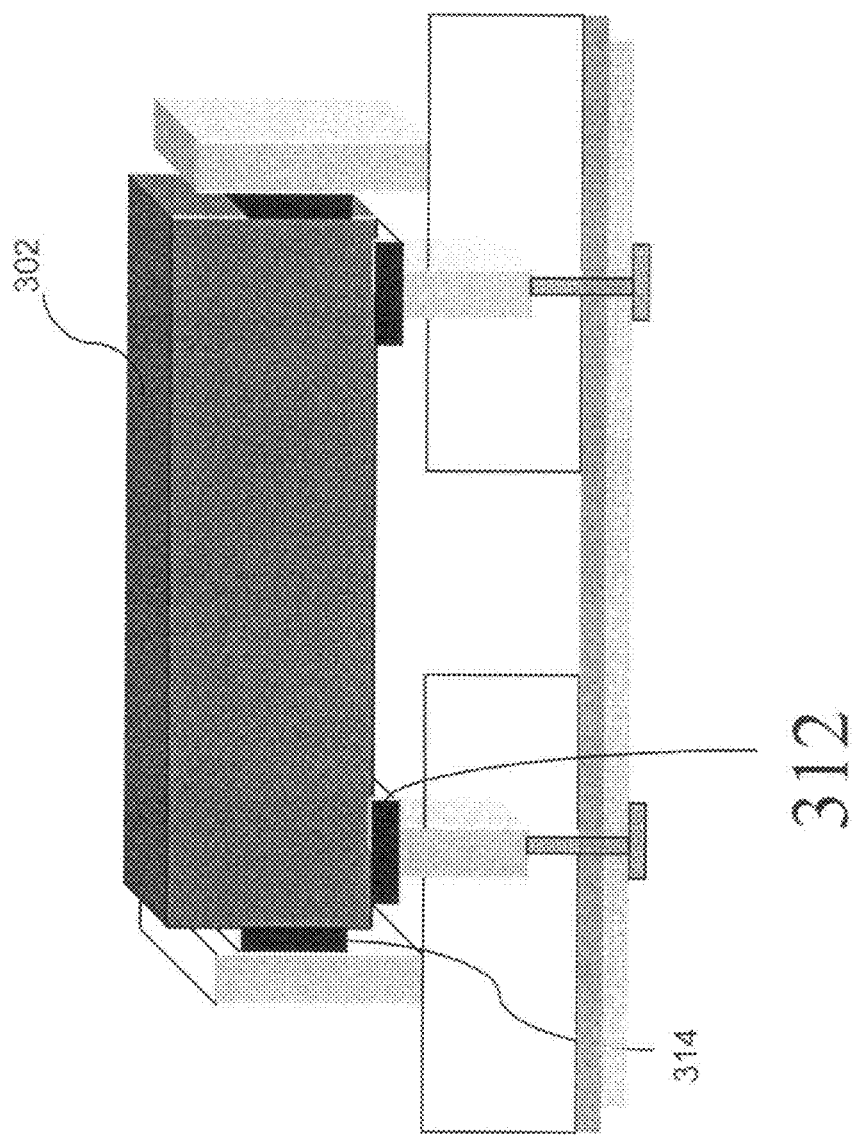
FIG. 4 is a 3D view of the chip package assembly according to an embodiment of the present invention.
Figure 5A:
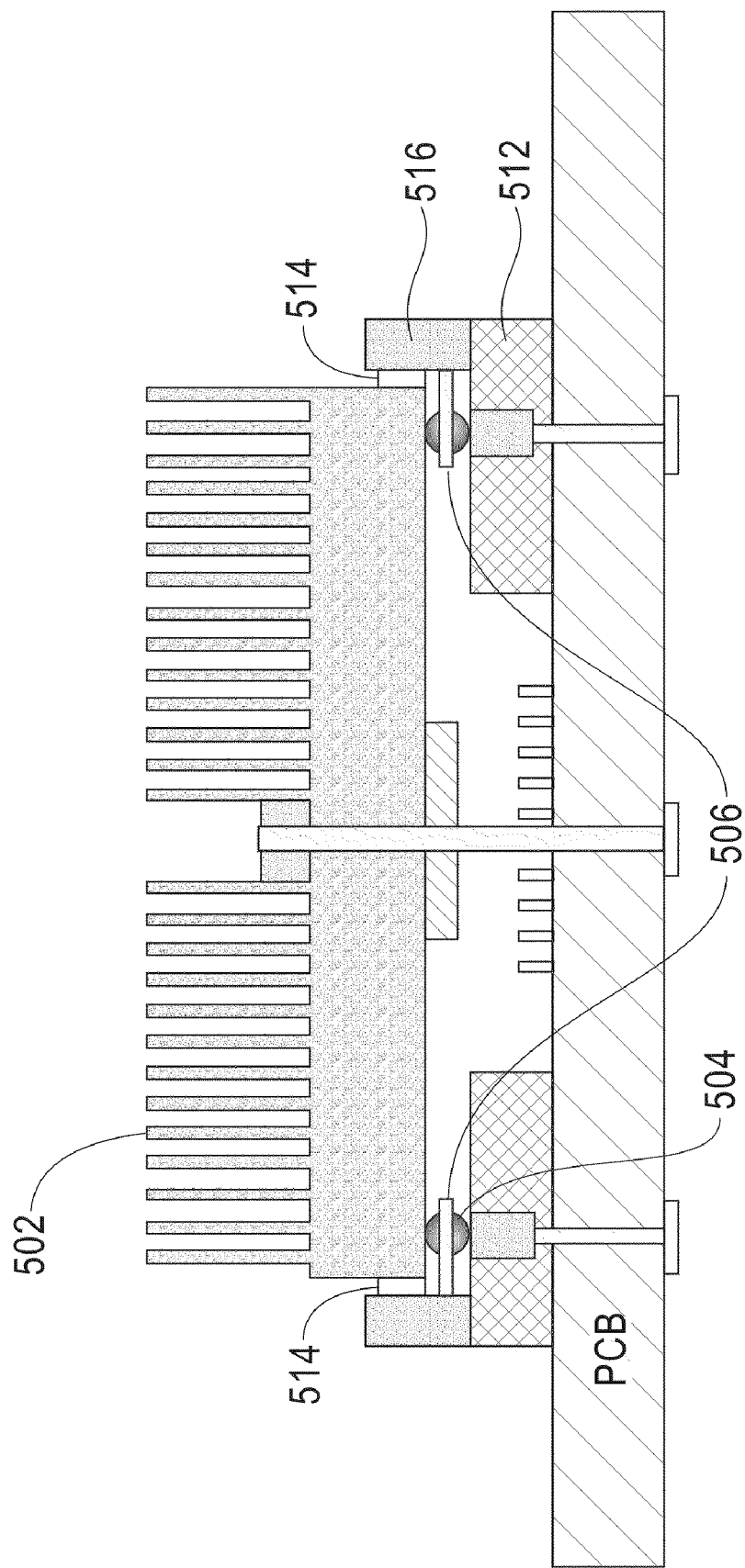
FIG. 5a is a side view of an illustration of a chip package assembly with ball bearings, according to an embodiment of the present invention.
Figure 5B:
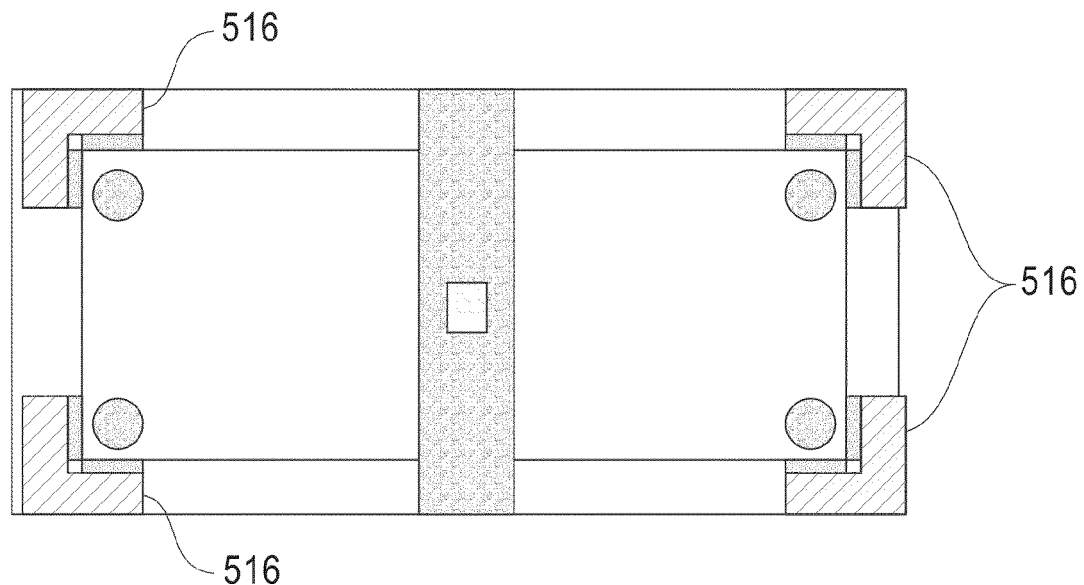
FIG. 5b is a top view of an illustration of a chip package assembly with ball bearings, according to an embodiment of the present invention.

Another embodiment is shown in FIG. 5a in which ball bearings 504 allow the heat sink 502 to move in a horizontal direction while limiting motion in the vertical direction. FIG. 5b illustrates how the horizontal motion is impeded by pads 514 secured to horizontal stops 516. The pads 514 are viscoelastic as shown in FIG. 4. The ball bearings 504 are secured by braces 506 attached to the horizontal stops 516. Note that these bearings 504 are only at the bottom, not the sides.

Figure 6:
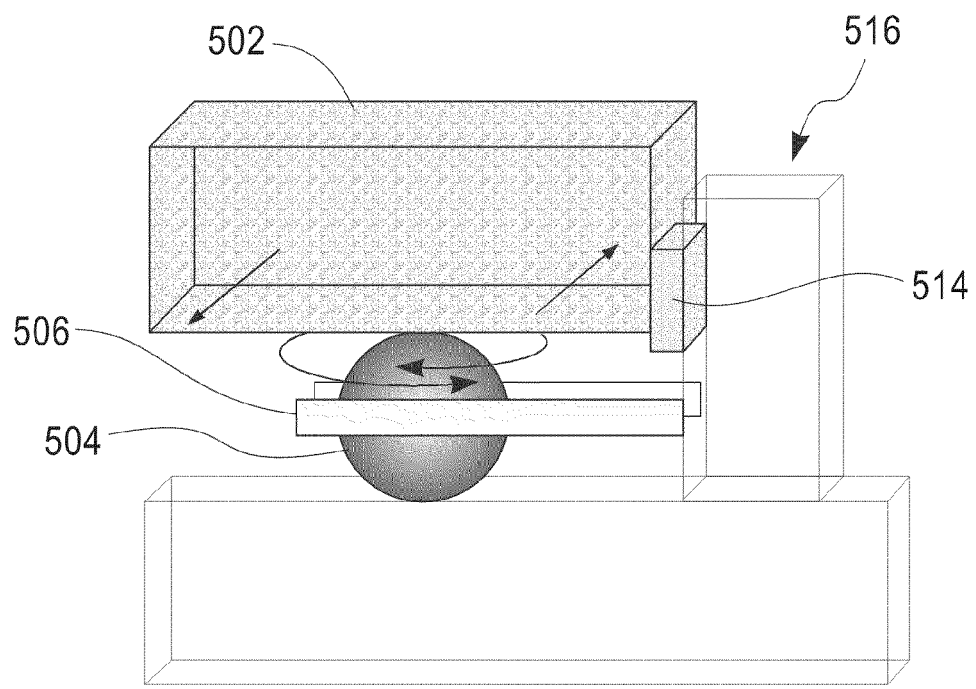
FIG. 6 is a close-up cut-away view of one of the ball bearings of FIG. 5, according to an embodiment of the present invention.

FIG. 6 shows a close-up view of one of the ball bearings 504. The arrows encircling the ball bearing 504 indicate how the ball bearing 504 can rotate, or spin, while remaining in a fixed position. The heat sink 502 is in contact with the top portion of the ball bearing 504. A slight horizontal motion of the heat sink 502 will produce a swiveling of the ball bearing 504. The horizontal stops 516 with the pads 514 attached will constrain the heat sink 502 from excessive movement.

It should be understood that what has been discussed and illustrated serves to provide examples of the possible embodiments within the spirit and scope of the invention; they should not be construed to limit the invention. One with knowledge in the art, after following the discussion and diagrams herein, can employ any viscoelastic material having the same properties as C-1105 bearings from EAR, or flexures properly positioned at the corner mounts as discussed above to provide the advantages of a reduction in package deformation while allowing for limited mechanical motion due to thermal expansion.

Another approach to limit mechanical motion in the presence of shocks and/or vibrations while allowing for slow thermal expansion is to deploy active servo control of the heat sink. H. Newton, Newton's Telecom Dictionary, $22^{nd}$ Edition, Copyright© 2006 Harry Newton, defines a servo as: "Servo: short for servomechanism. Devices which constantly detect a variable, and adjust a mechanism to response to changes."

Figure 7:
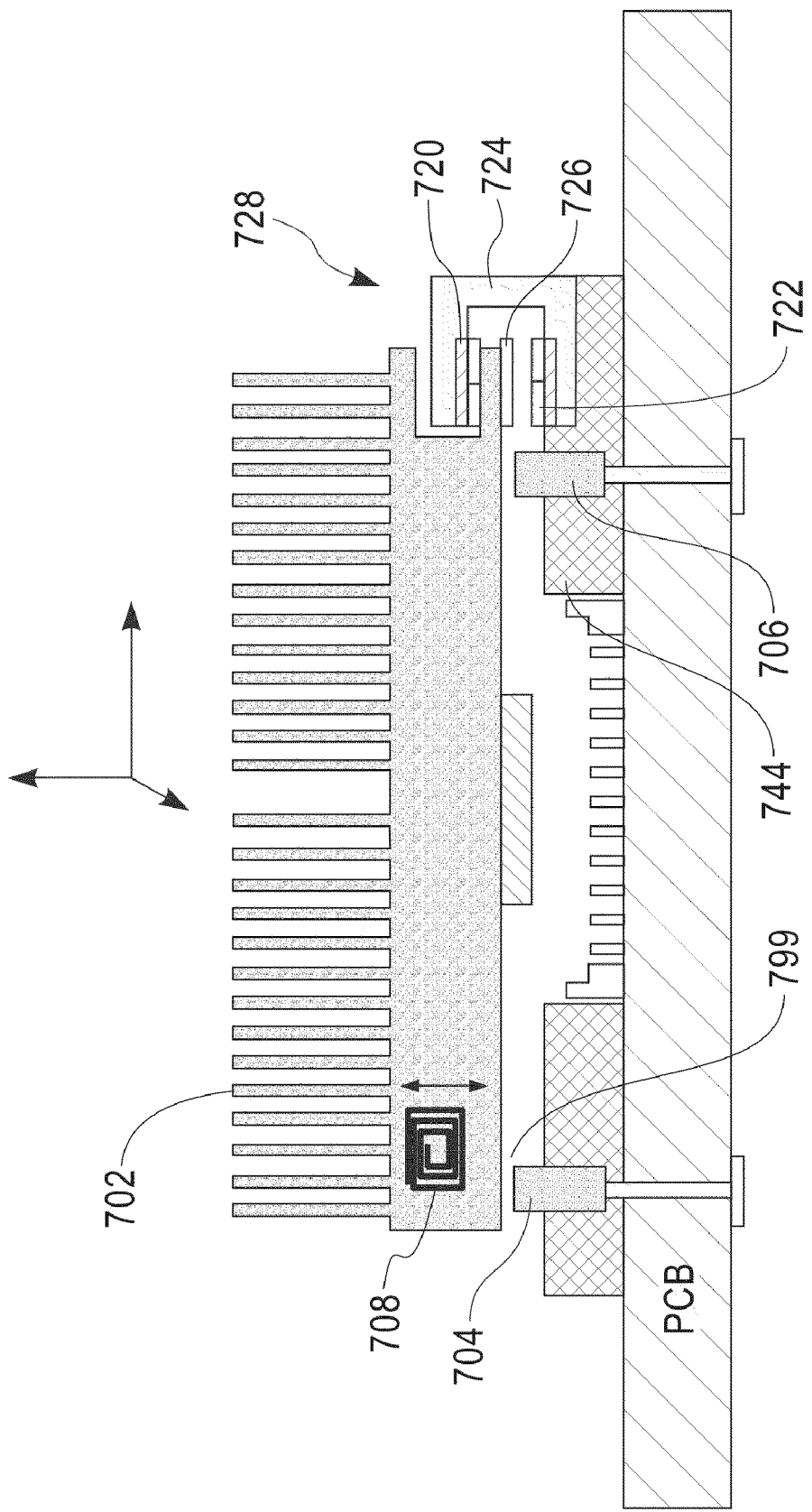
FIG. 7 is a side view of a chip package assembly using non-contact voice coil motors, according to an embodiment of the present invention.

Another embodiment of the present invention is shown in FIG. 7 wherein active servo control is employed to constrain the movement and/or expansion of a heat sink 702. Voice coil motors are used to actuate the heat sink 702. FIG. 7 shows one example of a voice coil motor 728 which controls the X motion of one corner of the heat sink 702. Each voice coil motor includes: a voice coil 726 mounted onto the heat sink 702 and a magnetic circuit consisting of permanently affixed magnets 720 and 722, with flux return paths and mechanical assembly to hold the magnets in place 724. The servo method of heat sink constraint differs from the previously described embodiments in that there may be no actual contact made between the heat sink 702 and the board 744. This is indicated in FIG. 7 by the gaps 799.

Figure 8:
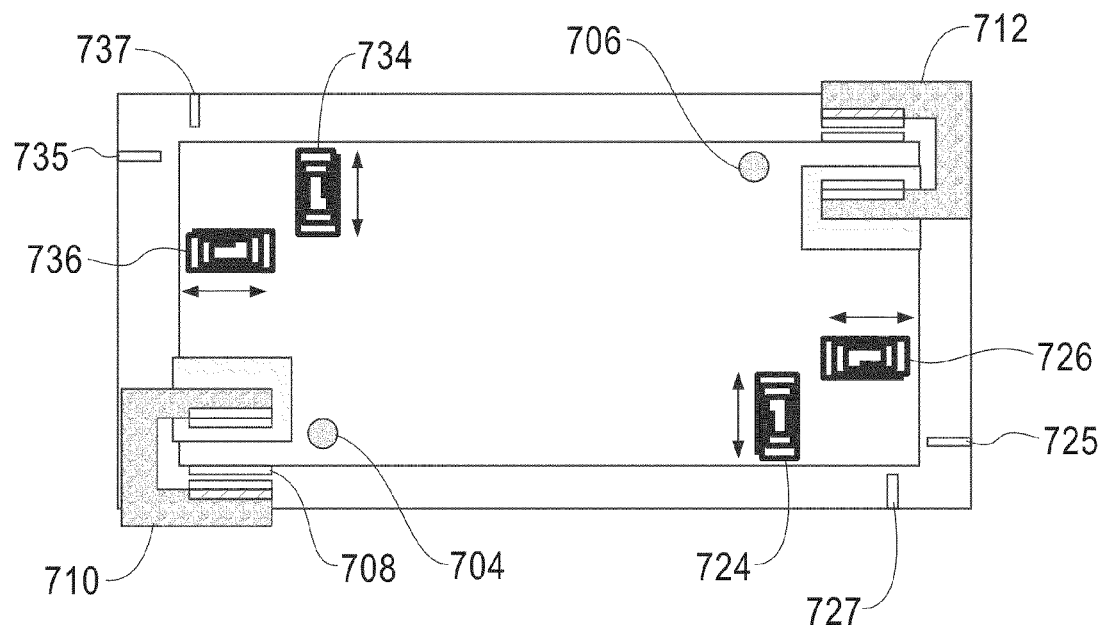
FIG. 8 is a top view of the assembly of FIG. 7, according to an embodiment of the present invention.

FIG. 8 shows a top view of the assembly of FIG. 7 with Z direction voice coil motors 710 and 712. FIG. 8 also shows the voice coils for the X and Y directions, 724, 726 and 734 and 736, in opposite corners, which are part of the voice coil motor assembly. For example 726 is the voice coil for voice coil motor 728 as shown in FIG. 7.

Gap sensors 735, 737, 725, 727 measure the location of the heat sink 702 edge to a fixed frame in the X and Y directions. Similarly, gap sensors 704 and 706 measure the location of the heat sink 702 to the frame 744 in the Z direction. One example of gap sensors may include proximity sensors using well known capacitance or eddy current measurement methods. The capacitance between two plates is proportional to 1/d, where d is the gap between the plates, thereby the gap can be measured by measuring C and computing 1/C. The voice coil motor and gap sensors are used in a servo loop to control the location of the heat sink 702 relative to the frame 744.

As shown in FIG. 8 two vertical axis voice coil motors 710 and 712 are disposed in opposite corners of the top frame 744 to maintain the Z height of the heat sink 702 relative to the frame 744. For example, a Z position signal Z gap 704 is compared to a Z gap target and the difference between the Z gap target and Z gap 704 will create an error signal as shown in FIG. 10 which is input to the servo controller Gc which produces a signal to control the current to the physical plant Gp which includes Z voice coil motors 710 and heat sink 702. The current applied to Z voice coil motor 710 will produce a force on the heat sink 702 to actuate it in the +Z or −Z direction until the Z gap value is equal to the target value. Similarly a second servo loop using Z gap 706 would be running in parallel, which for example may have a Z gap target 706 equal to the Z gap 704 target 704, to maintain the heat sink 702 parallel to the frame 744.

To maintain the X and Y position of the heat sink 702, horizontal axis voice coils 724, 726 are deployed in one corner of the heat sink 702 and voice coils 734 and 736 are deployed in the opposite corner of the heat sink 702. These voice coils are part of a voice coil motor assembly, an example of which is shown in FIG. 7 as 728. A position signal from the difference of Gap X=Xgap 735−Xgap 725 can be generated by measuring the gap in the X direction using Xgap sensors 735 and 725 and taking the difference between the two signals.

Similarly, by monitoring the gap in the Y direction using Y gap sensors 737 and 727 a position signal can be generated from the difference of Gap Y=Ygap 737−Ygap 727. These signals are input to the servo control system as shown in FIG. 10. For example, GapX would be compared to a GapX target, which for example may have a value of zero such as would occur when Xgap 735 is equal to X gap 725 and the heat sink 702 is centered with respect to the center of the frame 744.

The difference between the GapX and Gap X target will create an error signal as shown in FIG. 10 which is input to the servo controller, Gc, which produces a signal to control the current to Gp, the physical plant, which includes the voice coil motor and heat sink 702. The current applied to the voice coils 726, 736 to produces a force on the heat sink 702 to actuate it in the +X or −X direction until the GapX value is equal to the Gap X target value.

Figure 9:
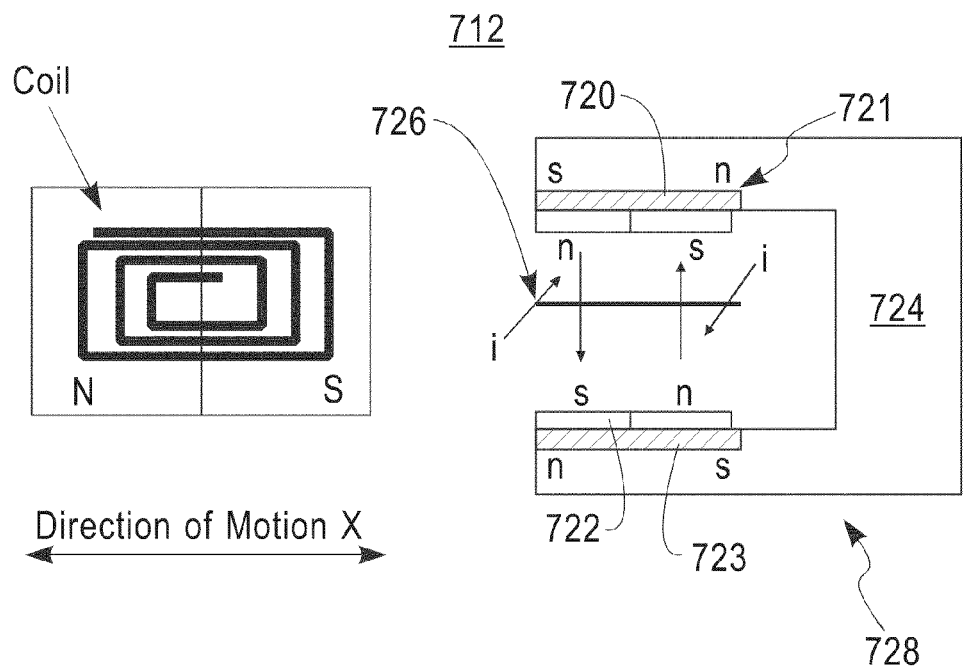
FIG. 9 is an exploded view of a voice coil motor, according to an embodiment of the present invention.

Referring to FIG. 9 there is shown an exploded top view of voice coil motor (VCM) 728 located in the right quadrant of FIG. 8. This VCM produces a motion of the heat sink 702 in the X direction when a current is applied to the voice coil 726. The VCM is comprised of permanent magnets 720 and 722, each of which is made of two magnets with reverse polarity. The magnets 720 and 722 and flux return plates 721, 723 are held in place by a non-magnetic mechanical fixture 724. When a current passes through the coil 726, the coil experiences a force in the +X or −X direction dependent on the direction of the current and transfers that force to the heat sink. Similarly a current passing through voice coil 736 applies a force in the X direction on the opposite corner of the heat sink 702.

The coils 726 and 736 are attached to the heat sink 702 and using the servo control system the heat sink 702 will remain centered with respect to the frame 744 in the X direction as previously described while allowing thermal expansion of the heat sink 702. Similarly, when using the servo control system with voice coils 724 and 734, the same control of the heat sink 702 in the Y direction can be achieved. In the Z direction, the gap 799 between the heat sink 702 and the frame 744 will be held to a predetermined target value, such that the heat sink 702 remains parallel to the frame 744.

Therefore, while there have been described what are presently considered to be the preferred embodiments, it will be understood by those skilled in the art that other modifications can be made within the spirit of the invention. Solutions which combine elements of the described solutions including using mechanical and servo control systems are also possible.

I claim:

1. A structure for attaching a heat sink to an integrated circuit chip, the structure comprising:
    a set of ball bearings positioned to allow motion of the heat sink in X and Y directions while constraining motion in a Z direction;
    wherein each ball bearing is positioned at corner sidewalls of the heat sink, such that force applied to the ball bearing from the heat sink will prevent mechanical movement of the heat sink in a vertical direction; and
    a plurality of braces for attaching the ball bearings to vertical limit stops, wherein said ball bearings can rotate within the braces.

2. The structure of claim 1 further comprising a compliant material that constrains the motion of the heat sink in the X and Y directions.

* * * * *